(12) United States Patent
Weeks et al.

(10) Patent No.: US 11,430,869 B2
(45) Date of Patent: Aug. 30, 2022

(54) METHOD FOR MAKING SUPERLATTICE STRUCTURES WITH REDUCED DEFECT DENSITIES

(71) Applicant: ATOMERA INCORPORATED, Los Gatos, CA (US)

(72) Inventors: Keith Doran Weeks, Chandler, AZ (US); Nyles Wynn Cody, Tempe, AZ (US); Marek Hytha, Brookline, MA (US); Robert J. Mears, Wellesley, MA (US); Robert John Stephenson, Duxford (GB)

(73) Assignee: ATOMERA INCORPORATED, Los Gatos, CA (US)

( * ) Notice: Subject to any disclaimer, the term of this patent is extended or adjusted under 35 U.S.C. 154(b) by 168 days.

(21) Appl. No.: 17/020,353

(22) Filed: Sep. 14, 2020

(65) Prior Publication Data
US 2020/0411645 A1  Dec. 31, 2020

Related U.S. Application Data

(62) Division of application No. 16/117,178, filed on Aug. 30, 2018, now Pat. No. 10,811,498.

(51) Int. Cl.
*H01L 29/15* (2006.01)
*H01L 21/02* (2006.01)
(Continued)

(52) U.S. Cl.
CPC ........ *H01L 29/154* (2013.01); *H01L 21/0245* (2013.01); *H01L 21/02488* (2013.01);
(Continued)

(58) Field of Classification Search
CPC ............... H01L 29/154; H01L 21/0245; H01L 21/02488; H01L 21/02507;
(Continued)

(56) References Cited

U.S. PATENT DOCUMENTS

| 4,937,204 A | 6/1990 | Ishibashi et al. |
| 5,216,262 A | 6/1993 | Tsu |

(Continued)

FOREIGN PATENT DOCUMENTS

| GB | 2347520 | 6/2000 | |
| WO | WO-2020046890 A1 * | 3/2020 | ......... H01L 29/1054 |

OTHER PUBLICATIONS

U.S. Appl. No. 15/664,028, filed Jul. 31, 2017 Mears et al.
(Continued)

*Primary Examiner* — Jami Valentine Miller
(74) *Attorney, Agent, or Firm* — Allen, Dyer, Doppelt + Gilchrist, P.A.

(57) ABSTRACT

A method for making a semiconductor device may include forming a superlattice on a substrate comprising a plurality of stacked groups of layers, with each group of layers including a plurality of stacked base semiconductor monolayers defining a base semiconductor portion, and at least one non-semiconductor monolayer constrained within a crystal lattice of adjacent base semiconductor portions. Moreover, forming at least one of the base semiconductor portions may include overgrowing the at least one base semiconductor portion and etching back the overgrown at least one base semiconductor portion.

13 Claims, 13 Drawing Sheets

(51) Int. Cl.
*H01L 21/324* (2006.01)
*H01L 21/306* (2006.01)

(52) U.S. Cl.
CPC .. *H01L 21/02507* (2013.01); *H01L 21/02647* (2013.01); *H01L 21/02694* (2013.01); *H01L 21/30604* (2013.01); *H01L 21/324* (2013.01)

(58) Field of Classification Search
CPC ......... H01L 21/02647; H01L 21/02694; H01L 21/30604; H01L 21/324
USPC ........................................................ 438/496
See application file for complete search history.

(56) References Cited

U.S. PATENT DOCUMENTS

| | | | |
|---|---|---|---|
| 5,357,119 A | 10/1994 | Wang et al. | |
| 5,683,934 A | 11/1997 | Candelaria | |
| 5,796,119 A | 8/1998 | Seabaugh | |
| 6,141,361 A | 10/2000 | Mears et al. | |
| 6,376,337 B1 | 4/2002 | Wang et al. | |
| 6,472,685 B2 | 10/2002 | Takagi | |
| 6,741,624 B2 | 5/2004 | Mears et al. | |
| 6,830,964 B1 | 12/2004 | Mears et al. | |
| 6,833,294 B1 | 12/2004 | Mears et al. | |
| 6,878,576 B1 | 4/2005 | Mears et al. | |
| 6,891,188 B2 | 5/2005 | Mears et al. | |
| 6,897,472 B2 | 5/2005 | Mears et al. | |
| 6,927,413 B2 | 8/2005 | Mears et al. | |
| 6,952,018 B2 | 10/2005 | Mears et al. | |
| 6,958,486 B2 | 10/2005 | Mears et al. | |
| 6,993,222 B2 | 1/2006 | Mears et al. | |
| 7,018,900 B2 | 3/2006 | Kreps | |
| 7,033,437 B2 | 4/2006 | Mears et al. | |
| 7,034,329 B2 | 4/2006 | Mears et al. | |
| 7,045,377 B2 | 5/2006 | Mears et al. | |
| 7,045,813 B2 | 5/2006 | Mears et al. | |
| 7,071,119 B2 | 7/2006 | Mears et al. | |
| 7,105,895 B2 | 9/2006 | Wang et al. | |
| 7,109,052 B2 | 9/2006 | Mears et al. | |
| 7,123,792 B1 | 10/2006 | Mears et al. | |
| 7,148,712 B1 | 12/2006 | Prey, Jr. et al. | |
| 7,153,763 B2 | 12/2006 | Hytha et al. | |
| 7,202,494 B2 | 4/2007 | Blanchard et al. | |
| 7,227,174 B2 | 6/2007 | Mears et al. | |
| 7,229,902 B2 | 6/2007 | Mears et al. | |
| 7,265,002 B2 | 9/2007 | Mears et al. | |
| 7,279,699 B2 | 10/2007 | Mears et al. | |
| 7,279,701 B2 | 10/2007 | Kreps | |
| 7,288,457 B2 | 10/2007 | Kreps | |
| 7,303,948 B2 | 12/2007 | Mears et al. | |
| 7,312,128 B2 | 12/2007 | Kim et al. | |
| 7,432,524 B2 | 10/2008 | Mears et al. | |
| 7,435,988 B2 | 10/2008 | Mears et al. | |
| 7,436,026 B2 | 10/2008 | Kreps | |
| 7,446,002 B2 | 11/2008 | Mears et al. | |
| 7,446,334 B2 | 11/2008 | Mears et al. | |
| 7,491,587 B2 | 2/2009 | Rao | |
| 7,514,328 B2 | 4/2009 | Rao | |
| 7,517,702 B2 | 4/2009 | Halilov et al. | |
| 7,531,828 B2 | 5/2009 | Mears et al. | |
| 7,531,829 B2 | 5/2009 | Blanchard | |
| 7,531,850 B2 | 5/2009 | Blanchard | |
| 7,586,116 B2 | 9/2009 | Kreps et al. | |
| 7,586,165 B2 | 9/2009 | Blanchard | |
| 7,598,515 B2 | 10/2009 | Mears et al. | |
| 7,612,366 B2 | 11/2009 | Mears et al. | |
| 7,625,767 B2 | 12/2009 | Huang et al. | |
| 7,659,539 B2 | 2/2010 | Kreps et al. | |
| 7,682,940 B2 | 3/2010 | Ye et al. | |
| 7,700,447 B2 | 4/2010 | Dukovski et al. | |
| 7,718,996 B2 | 5/2010 | Dukovski et al. | |
| 7,781,827 B2 | 8/2010 | Rao | |
| 7,812,339 B2 | 10/2010 | Mears et al. | |
| 7,863,066 B2 | 1/2011 | Mears et al. | |
| 7,880,161 B2 | 2/2011 | Mears et al. | |
| 7,928,425 B2 | 4/2011 | Rao | |
| 7,951,684 B2 | 5/2011 | Ponomarev | |
| 8,389,974 B2 | 3/2013 | Mears et al. | |
| 9,099,423 B2 | 8/2015 | Weeks et al. | |
| 9,275,996 B2 | 3/2016 | Mears et al. | |
| 9,312,131 B2 | 4/2016 | Bauer et al. | |
| 9,406,753 B2 | 8/2016 | Mears et al. | |
| 9,558,939 B1 | 1/2017 | Stephenson et al. | |
| 9,899,479 B2 | 2/2018 | Mears et al. | |
| 10,566,191 B1* | 2/2020 | Weeks | ............ H01L 21/823468 |
| 2003/0034529 A1 | 2/2003 | Fitzgerald et al. | |
| 2003/0057416 A1 | 3/2003 | Currie et al. | |
| 2005/0279991 A1* | 12/2005 | Mears | ................. H01L 29/7833 |
| | | | 257/18 |
| 2005/0282330 A1 | 12/2005 | Mears et al. | |
| 2006/0220118 A1 | 10/2006 | Stephenson et al. | |
| 2006/0267130 A1 | 11/2006 | Rao | |
| 2007/0012910 A1 | 1/2007 | Mears et al. | |
| 2007/0020833 A1 | 1/2007 | Mears et al. | |
| 2008/0012004 A1 | 1/2008 | Huang et al. | |
| 2008/0054248 A1 | 3/2008 | Chua et al. | |
| 2008/0258134 A1 | 10/2008 | Mears et al. | |
| 2011/0215299 A1 | 9/2011 | Rao | |
| 2015/0357414 A1 | 12/2015 | Mears | |
| 2016/0099317 A1 | 4/2016 | Mears et al. | |
| 2016/0149023 A1 | 5/2016 | Mears et al. | |
| 2016/0336406 A1 | 11/2016 | Mears et al. | |
| 2016/0358773 A1 | 12/2016 | Mears et al. | |
| 2017/0263809 A1 | 9/2017 | Atanackovic | |
| 2017/0294514 A1 | 10/2017 | Mears | |
| 2017/0301757 A1 | 10/2017 | Mears et al. | |
| 2017/0330609 A1 | 11/2017 | Roy | |
| 2018/0040714 A1 | 2/2018 | Mears et al. | |
| 2018/0040724 A1 | 2/2018 | Mears et al. | |
| 2018/0040725 A1 | 2/2018 | Mears et al. | |
| 2018/0040743 A1 | 2/2018 | Mears et al. | |
| 2020/0075327 A1* | 3/2020 | Weeks | ............ H01L 21/823468 |

OTHER PUBLICATIONS

U.S. Appl. No. 15/678,616, filed Aug. 16, 2017 Richard Stephen Roy.
U.S. Appl. No. 15/678,658, filed Aug. 16, 2017 Richard Stephen Roy.
U.S. Appl. No. 15/842,981, filed Dec. 15, 2017 Chen et al.
U.S. Appl. No. 15/842,989, filed Dec. 15, 2017 Mears et al.
U.S. Appl. No. 15/842,990, filed Dec. 15, 2017 Chen et al.
U.S. Appl. No. 15/842,993, filed Dec. 15, 2017 Chen et al.
U.S. Appl. No. 15/843,013, filed Dec. 15, 2017 Mears et al.
U.S. Appl. No. 15/843,017, filed Dec. 15, 2017 Chen et al.
U.S. Appl. No. 15/843,044, filed Dec. 15, 2017 Chen et al.
U.S. Appl. No. 15/843,077, filed Dec. 15, 2017 Chen et al.
U.S. Appl. No. 15/843,106, filed Dec. 15, 2017 Chen et al.
U.S. Appl. No. 15/843,113, filed Dec. 15, 2017 Chen et al.
U.S. Appl. No. 15/843,121, filed Dec. 15, 2017 Chen et al.
U.S. Appl. No. 15/843,136, filed Dec. 15, 2017 Chen et al.
U.S. Appl. No. 15/916,766, filed Mar. 9, 2018 Weeks et al.
U.S. Appl. No. 15/916,831, filed Mar. 9, 2018 Weeks et al.
U.S. Appl. No. 15/980,893, filed May 16, 2018 Hideki Takeuchi.
U.S. Appl. No. 15/980,902, filed May 16, 2018 Hideki Takeuchi.
U.S. Appl. No. 16/007,186, filed Jun. 13, 2018 Kalipatnam Vivek Rao.
U.S. Appl. No. 16/007,209, filed Jun. 13, 2018 Kalipatnam Vivek Rao.
U.S. Appl. No. 16/104,261, filed Aug. 17, 2018 Stephenson et al.
U.S. Appl. No. 16/104,282, filed Aug. 17, 2018 Stephenson et al.
U.S. Appl. No. 16/117,202, filed Aug. 30, 2018 Weeks et al.
Luo et al., "Chemical Design of Direct-Gap Light-Emitting Silicon" published in Physical Review Letters, vol. 89, No. 7; Aug. 12, 2002; 4 pgs. See Priority U.S. Appl. No. 16/117,178, filed Aug. 30, 2018.
Mears et al. "Simultaneous Carrier Transport Enhancement and variability reduction in Si MOSFETs by insertion of partial Monolayers of oxygen" IEEE silicon Nanoelectronics Workshop (2012):

(56) References Cited

OTHER PUBLICATIONS (Date of conference Jun. 10-11, 2012) pp. 2. See Priority U.S. Appl. No. 16/117,178, filed Aug. 30, 2018.
Novikov et al. "Silicon-based Optoelectronics" 1999-2003, pp. 1-6. See Priority U.S. Appl. No. 16/117,178, filed Aug. 30, 2018.
R. Tsu Phenomena in silicon nanostructure device published online Sep. 6, 2000 by Applied Physics and Materials Science & Processing, pp. 391-402 See Priority U.S. Appl. No. 16/117,178, filed Aug. 30, 2018.
R. Tsu "Si Based Green ELD: Si—Oxygen Superlattice" wysiwyg://l/http://www3.interscience.wiley.com/cgi-bin/abstract/72512946/ start: published online Jul. 21, 2000; 2 pgs. Abstract Only. See Priority U.S. Appl. No. 16/117,178, filed Aug. 30, 2018
Xu et al. "Effectiveness of Quasi-confinement technology for improving P-chanel Si an Ge MOSSFET performance" Department of Electrical Engineering and Computer Science, University of California, Berkeley, 2012, pp. 2. mearstech.net; retrieved from Internet Jan. 18, 2016. See Priority U.S. Appl. No. 16/117,178, filed Aug. 30, 2018.
Xu et al. "Extension of planar bulk n-channel MOSFET scaling with oxygen insertion technology" IEEE Transactions on Electron devices, vol. 61, No. 9; Sep. 2014. pp. 3345-3349. See Priority U.S. Appl. No. 16/117,178, filed Aug. 30, 2018.
Xu et al., "MOSFET performance and scalability enhancement by insertion of oxygen layers", Department of Electrical Engineering and Computer Science, University of California, Berkeley, 2012, pp. 1-4. See Priority U.S. Appl. No. 16/117,178, filed Aug. 30, 2018.
Abbadie et al. "A review of different and promising defect etching techniques : from Si to Ge" ECS Transactions, 10 (1) 3-19 (2007) pp. 17. See Priority U.S. Appl. No. 16/117,178, filed Aug. 30, 2018
Bedell et al. "Quick Turnaround Technique for Highlighting Defects in Thin Si/SiGe Bilayers" Electrochem. Solid-State Lett. 2004 vol. 7, issue 5, G105-G107. Abstract Only. See Priority U.S. Appl. No. 16/117,178, filed Aug. 30, 2018.
Lu et al. "Threading vs Misfit Dislocations in Strained Si/SiGe Heterostructures: Preferential Etching and Minority Carrier Transient Spectroscopy" ECS Trans. 2006 vol. 2, issue 2, 569-577. Abstract Only. See Priority U.S. Appl. No. 16/117,178, filed Aug. 30, 2018.

\* cited by examiner

METHOD FOR MAKING SUPERLATTICE STRUCTURES WITH REDUCED DEFECT DENSITIES

TECHNICAL FIELD

The present disclosure generally relates to semiconductor devices and, more particularly, to methods for making semiconductor device with enhanced semiconductor materials.

BACKGROUND

Structures and techniques have been proposed to enhance the performance of semiconductor devices, such as by enhancing the mobility of the charge carriers. For example, U.S. Patent Application No. 2003/0057416 to Currie et al. discloses strained material layers of silicon, silicon-germanium, and relaxed silicon and also including impurity-free zones that would otherwise cause performance degradation. The resulting biaxial strain in the upper silicon layer alters the carrier mobilities enabling higher speed and/or lower power devices. Published U.S. Patent Application No. 2003/0034529 to Fitzgerald et al. discloses a CMOS inverter also based upon similar strained silicon technology.

U.S. Pat. No. 6,472,685 B2 to Takagi discloses a semiconductor device including a silicon and carbon layer sandwiched between silicon layers so that the conduction band and valence band of the second silicon layer receive a tensile strain. Electrons having a smaller effective mass, and which have been induced by an electric field applied to the gate electrode, are confined in the second silicon layer, thus, an n-channel MOSFET is asserted to have a higher mobility.

U.S. Pat. No. 4,937,204 to Ishibashi et al. discloses a superlattice in which a plurality of layers, less than eight monolayers, and containing a fractional or binary or a binary compound semiconductor layer, are alternately and epitaxially grown. The direction of main current flow is perpendicular to the layers of the superlattice.

U.S. Pat. No. 5,357,119 to Wang et al. discloses a Si—Ge short period superlattice with higher mobility achieved by reducing alloy scattering in the superlattice. Along these lines, U.S. Pat. No. 5,683,934 to Candelaria discloses an enhanced mobility MOSFET including a channel layer comprising an alloy of silicon and a second material substitutionally present in the silicon lattice at a percentage that places the channel layer under tensile stress.

U.S. Pat. No. 5,216,262 to Tsu discloses a quantum well structure comprising two barrier regions and a thin epitaxially grown semiconductor layer sandwiched between the barriers. Each barrier region consists of alternate layers of SiO2/Si with a thickness generally in a range of two to six monolayers. A much thicker section of silicon is sandwiched between the barriers.

An article entitled "Phenomena in silicon nanostructure devices" also to Tsu and published online Sep. 6, 2000 by Applied Physics and Materials Science & Processing, pp. 391-402 discloses a semiconductor-atomic superlattice (SAS) of silicon and oxygen. The Si/O superlattice is disclosed as useful in a silicon quantum and light-emitting devices. In particular, a green electroluminescence diode structure was constructed and tested. Current flow in the diode structure is vertical, that is, perpendicular to the layers of the SAS. The disclosed SAS may include semiconductor layers separated by adsorbed species such as oxygen atoms, and CO molecules. The silicon growth beyond the adsorbed monolayer of oxygen is described as epitaxial with a fairly low defect density. One SAS structure included a 1.1 nm thick silicon portion that is about eight atomic layers of silicon, and another structure had twice this thickness of silicon. An article to Luo et al. entitled "Chemical Design of Direct-Gap Light-Emitting Silicon" published in Physical Review Letters, Vol. 89, No. 7 (Aug. 12, 2002) further discusses the light emitting SAS structures of Tsu.

Published International Application WO 02/103,767 A1 to Wang, Tsu and Lofgren, discloses a barrier building block of thin silicon and oxygen, carbon, nitrogen, phosphorous, antimony, arsenic or hydrogen to thereby reduce current flowing vertically through the lattice more than four orders of magnitude. The insulating layer/barrier layer allows for low defect epitaxial silicon to be deposited next to the insulating layer.

Published Great Britain Patent Application 2,347,520 to Mears et al. discloses that principles of Aperiodic Photonic Band-Gap (APBG) structures may be adapted for electronic bandgap engineering. In particular, the application discloses that material parameters, for example, the location of band minima, effective mass, etc., can be tailored to yield new aperiodic materials with desirable band-structure characteristics. Other parameters, such as electrical conductivity, thermal conductivity and dielectric permittivity or magnetic permeability are disclosed as also possible to be designed into the material.

Furthermore, U.S. Pat. No. 6,376,337 to Wang et al. discloses a method for producing an insulating or barrier layer for semiconductor devices which includes depositing a layer of silicon and at least one additional element on the silicon substrate whereby the deposited layer is substantially free of defects such that epitaxial silicon substantially free of defects can be deposited on the deposited layer. Alternatively, a monolayer of one or more elements, preferably comprising oxygen, is absorbed on a silicon substrate. A plurality of insulating layers sandwiched between epitaxial silicon forms a barrier composite.

Despite the existence of such approaches, further enhancements may be desirable for using advanced semiconductor processing techniques in certain applications.

SUMMARY

A method for making a semiconductor device may include forming a superlattice on a substrate comprising a plurality of stacked groups of layers, with each group of layers including a plurality of stacked base semiconductor monolayers defining a base semiconductor portion and at least one non-semiconductor monolayer constrained within a crystal lattice of adjacent base semiconductor portions. Moreover, forming at least one of the base semiconductor portions may include overgrowing the at least one base semiconductor portion and etching back the overgrown at least one base semiconductor portion.

More particularly, forming each base semiconductor portion may further include forming a first set of the base semiconductor monolayers, performing a thermal anneal, and forming a second set of the base semiconductor monolayers on the first set after the thermal anneal. By way of example, the first set of the base semiconductor monolayers may have a thickness in a range of 6-10 Å, and the second set of the base semiconductor monolayers may have a thickness in a range of 4-50 Å.

In accordance with one example, etching back the overgrown at least one base semiconductor portion may comprise etching between 2 and 50 Å of the at least one base semiconductor portion. Also by way of example, etching back the overgrown at least one base semiconductor portion may comprise etching the overgrown at least one base semiconductor portion at a temperature in a range of 500 to 750° C.

Furthermore, forming the superlattice may further include forming a semiconductor cap layer by forming a first semiconductor cap portion on the plurality of groups of layers at a first temperature, and forming a second semiconductor cap portion on the first semiconductor cap portion at a second temperature higher than the first temperature. By way of example, the first semiconductor cap portion may have a thickness in a range of 4 to 100 Å. Also by way of example, the base semiconductor monolayers may comprise silicon monolayers, and the non-semiconductor monolayers may comprise oxygen.

DETAILED DESCRIPTION

Figure 1:
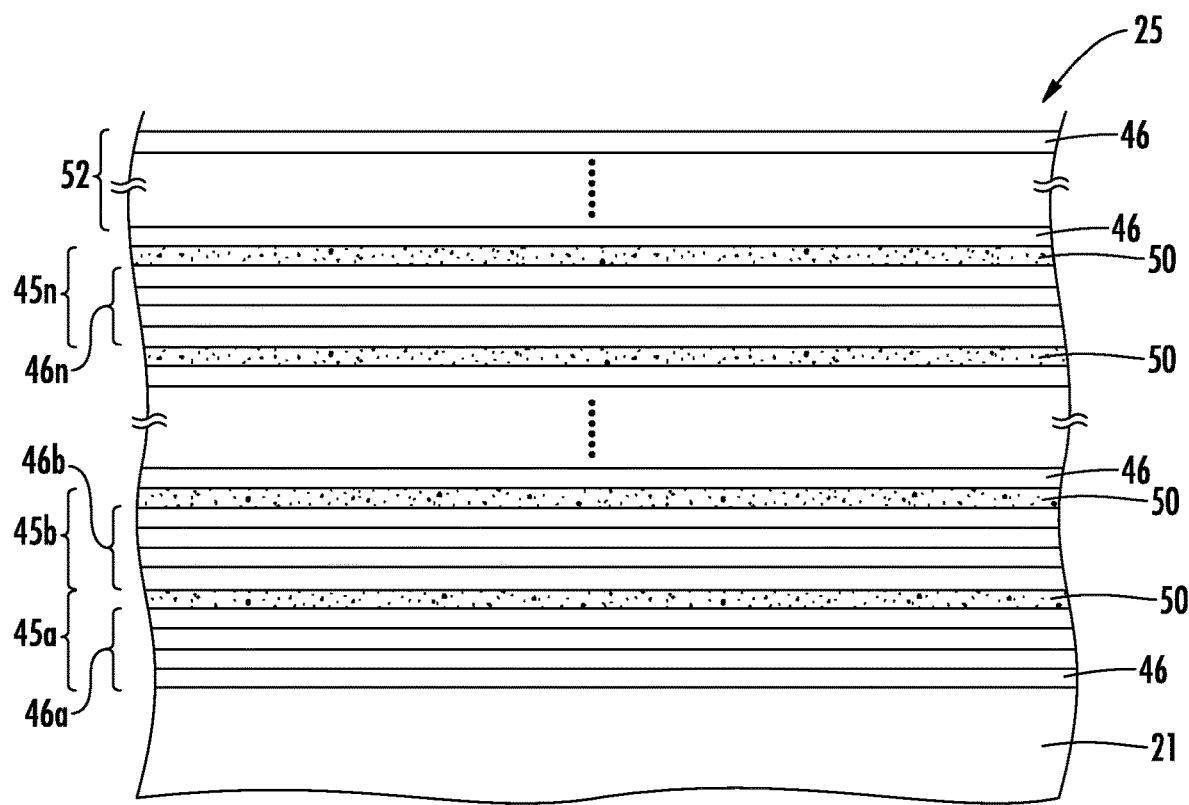
FIG. 1 is a greatly enlarged schematic cross-sectional view of a superlattice for use in a semiconductor device in accordance with an example embodiment.

Example embodiments will now be described more fully hereinafter with reference to the accompanying drawings, in which the example embodiments are shown. The embodiments may, however, be implemented in many different forms and should not be construed as limited to the specific examples set forth herein. Rather, these embodiments are provided so that this disclosure will be thorough and complete. Like numbers refer to like elements throughout, and prime notation is used to indicate similar elements in different embodiments.

Generally speaking, the present disclosure relates to a process for making an enhanced semiconductor superlattice or film, which is also referred to as an "MST" film or layer, or "MST technology", in this disclosure. More particularly, the MST technology relates to advanced semiconductor materials such as the superlattice 25 described further below.

Applicant theorizes, without wishing to be bound thereto, that certain superlattices as described herein reduce the effective mass of charge carriers and that this thereby leads to higher charge carrier mobility. Effective mass is described with various definitions in the literature. As a measure of the improvement in effective mass Applicant's use a "conductivity reciprocal effective mass tensor", $M_e^{-1}$ and $M_h^{-1}$ for electrons and holes respectively, defined as:

$$M_{e,i,j}^{-1}(E_F, T) = \frac{\sum_{E>E_F} \int_{B.Z.} (\nabla_k E(k,n))_i (\nabla_k E(k,n))_j \frac{\partial f(E(k,n), E_F, T)}{\partial E} d^3k}{\sum_{E>E_F} \int_{B.Z.} f(E(k,n), E_F, T) d^3k}$$

for electrons and:

$$M_{h,i,j}^{-1}(E_F, T) = \frac{-\sum_{E>E_F} \int_{B.Z.} (\nabla_k E(k,n))_i (\nabla_k E(k,n))_j \frac{\partial f(E(k,n), E_F, T)}{\partial E} d^3k}{\sum_{E>E_F} \int_{B.Z.} (1 - f(E(k,n), E_F, T)) d^3k}$$

for holes, where f is the Fermi-Dirac distribution, $E_F$ is the Fermi energy, T is the temperature, E(k,n) is the energy of an electron in the state corresponding to wave vector k and the $n^{th}$ energy band, the indices i and j refer to Cartesian coordinates x, y and z, the integrals are taken over the Brillouin zone (B.Z.), and the summations are taken over bands with energies above and below the Fermi energy for electrons and holes respectively.

Applicant's definition of the conductivity reciprocal effective mass tensor is such that a tensorial component of the conductivity of the material is greater for greater values of the corresponding component of the conductivity reciprocal effective mass tensor. Again Applicant theorizes without wishing to be bound thereto that the superlattices described herein set the values of the conductivity reciprocal effective mass tensor so as to enhance the conductive properties of the material, such as typically for a preferred direction of charge carrier transport. The inverse of the appropriate tensor element is referred to as the conductivity effective mass. In other words, to characterize semiconductor material structures, the conductivity effective mass for electrons/holes as described above and calculated in the direction of intended carrier transport is used to distinguish improved materials.

Applicant has identified improved materials or structures for use in semiconductor devices. More specifically, Applicant has identified materials or structures having energy band structures for which the appropriate conductivity effective masses for electrons and/or holes are substantially less than the corresponding values for silicon. In addition to the enhanced mobility characteristics of these structures, they may also be formed or used in such a manner that they provide piezoelectric, pyroelectric, and/or ferroelectric properties that are advantageous for use in a variety of different types of devices, as will be discussed further below.

Figure 2:
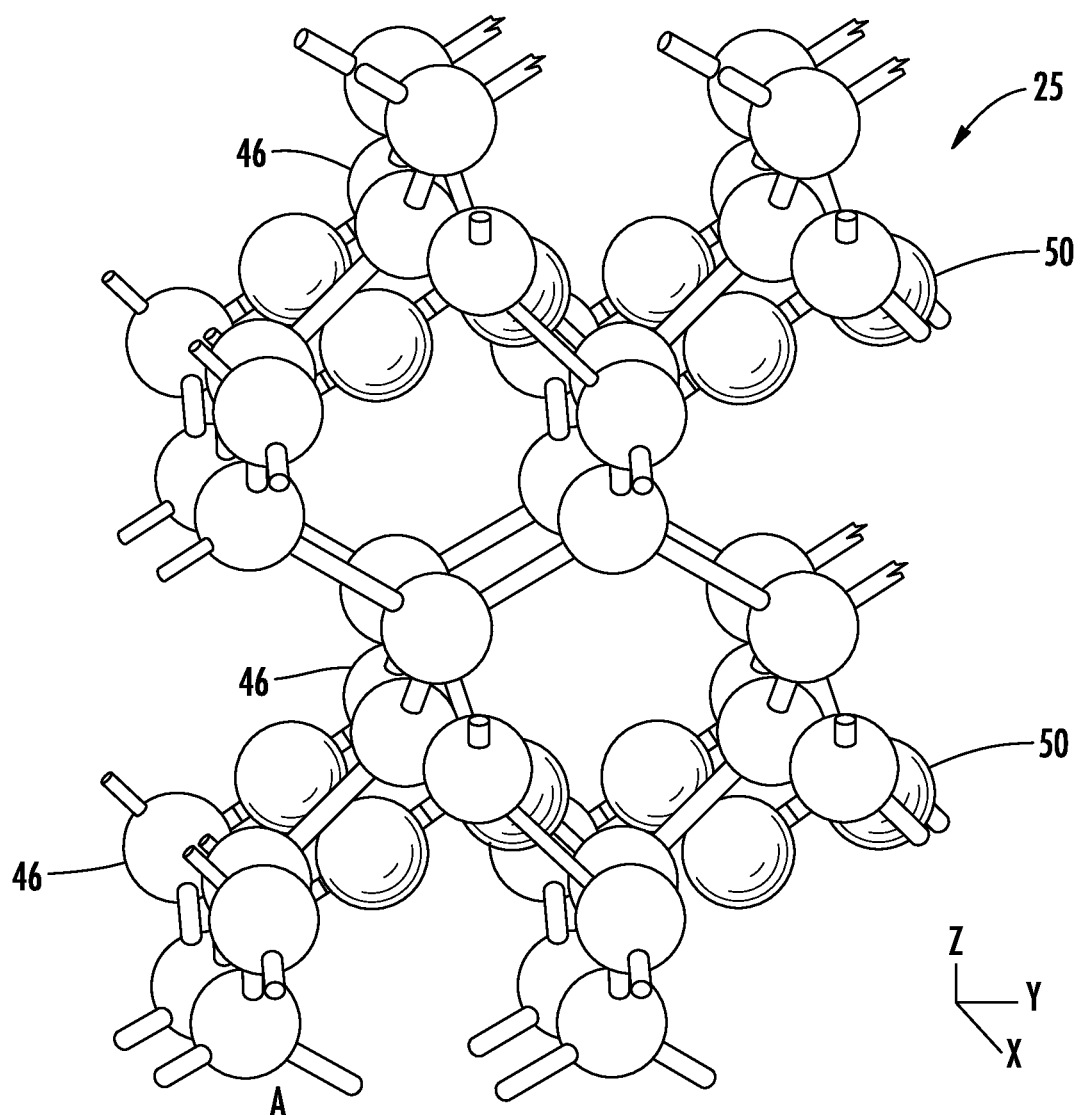
FIG. 2 is a perspective schematic atomic diagram of a portion of the superlattice shown in FIG. 1.

Referring now to FIGS. 1 and 2, the materials or structures are in the form of a superlattice 25 whose structure is controlled at the atomic or molecular level and may be formed using known techniques of atomic or molecular layer deposition. The superlattice 25 includes a plurality of layer groups 45a-45n arranged in stacked relation, as perhaps best understood with specific reference to the schematic cross-sectional view of FIG. 1.

Each group of layers 45a-45n of the superlattice 25 illustratively includes a plurality of stacked base semiconductor monolayers 46 defining a respective base semiconductor portion 46a-46n and an energy band-modifying layer 50 thereon. The energy band-modifying layers 50 are indicated by stippling in FIG. 1 for clarity of illustration.

The energy band-modifying layer 50 illustratively includes one non-semiconductor monolayer constrained within a crystal lattice of adjacent base semiconductor portions. By "constrained within a crystal lattice of adjacent base semiconductor portions" it is meant that at least some semiconductor atoms from opposing base semiconductor portions 46a-46n are chemically bound together through the non-semiconductor monolayer 50 therebetween, as seen in FIG. 2. Generally speaking, this configuration is made possible by controlling the amount of non-semiconductor material that is deposited on semiconductor portions 46a-46n through atomic layer deposition techniques so that not all (i.e., less than full or 100% coverage) of the available semiconductor bonding sites are populated with bonds to non-semiconductor atoms, as will be discussed further below. Thus, as further monolayers 46 of semiconductor material are deposited on or over a non-semiconductor monolayer 50, the newly deposited semiconductor atoms will populate the remaining vacant bonding sites of the semiconductor atoms below the non-semiconductor monolayer.

In other embodiments, more than one such non-semiconductor monolayer may be possible. It should be noted that reference herein to a non-semiconductor or semiconductor monolayer means that the material used for the monolayer would be a non-semiconductor or semiconductor if formed in bulk. That is, a single monolayer of a material, such as silicon, may not necessarily exhibit the same properties that it would if formed in bulk or in a relatively thick layer, as will be appreciated by those skilled in the art.

Applicant theorizes without wishing to be bound thereto that energy band-modifying layers 50 and adjacent base semiconductor portions 46a-46n cause the superlattice 25 to have a lower appropriate conductivity effective mass for the charge carriers in the parallel layer direction than would otherwise be present. Considered another way, this parallel direction is orthogonal to the stacking direction. The band modifying layers 50 may also cause the superlattice 25 to have a common energy band structure, while also advantageously functioning as an insulator between layers or regions vertically above and below the superlattice.

Moreover, this superlattice structure may also advantageously act as a barrier to dopant and/or material diffusion between layers vertically above and below the superlattice 25. These properties may thus advantageously allow the superlattice 25 to provide an interface for high-K dielectrics which not only reduces diffusion of the high-K material into the channel region, but which may also advantageously reduce unwanted scattering effects and improve device mobility, as will be appreciated by those skilled in the art.

It is also theorized that semiconductor devices including the superlattice 25 may enjoy a higher charge carrier mobility based upon the lower conductivity effective mass than would otherwise be present. In some embodiments, and as a result of the band engineering achieved by the present invention, the superlattice 25 may further have a substantially direct energy bandgap that may be particularly advantageous for opto-electronic devices, for example.

The superlattice 25 also illustratively includes a cap layer 52 on an upper layer group 45n. The cap layer 52 may comprise a plurality of base semiconductor monolayers 46. The cap layer 52 may range from 2 monolayers to 25 Å or more (e.g., 100 Å) of the base semiconductor, and, more preferably between 10 to 50 monolayers.

Each base semiconductor portion 46a-46n may comprise a base semiconductor selected from the group consisting of Group IV semiconductors, Group III-V semiconductors, and Group II-VI semiconductors. Of course, the term Group IV semiconductors also includes Group IV-IV semiconductors, as will be appreciated by those skilled in the art. More particularly, the base semiconductor may comprise at least one of silicon and germanium, for example.

Each energy band-modifying layer 50 may comprise a non-semiconductor selected from the group consisting of oxygen, nitrogen, fluorine, carbon and carbon-oxygen, for example. The non-semiconductor is also desirably thermally stable through deposition of a next layer to thereby facilitate manufacturing. In other embodiments, the non-semiconductor may be another inorganic or organic element or compound that is compatible with the given semiconductor processing as will be appreciated by those skilled in the art. More particularly, the base semiconductor may comprise at least one of silicon and germanium, for example It should be noted that the term monolayer is meant to include a single atomic layer and also a single molecular layer. It is also noted that the energy band-modifying layer 50 provided by a single monolayer is also meant to include a monolayer wherein not all of the possible sites are occupied (i.e., there is less than full or 100% coverage). For example, with particular reference to the atomic diagram of FIG. 2, a 4/1 repeating structure is illustrated for silicon as the base semiconductor material, and oxygen as the energy band-modifying material. Only half of the possible sites for oxygen are occupied in the illustrated example.

In other embodiments and/or with different materials this one-half occupation would not necessarily be the case as will be appreciated by those skilled in the art. Indeed it can be seen even in this schematic diagram, that individual atoms of oxygen in a given monolayer are not precisely aligned along a flat plane as will also be appreciated by those of skill in the art of atomic deposition. By way of example, a preferred occupation range is from about one-eighth to one-half of the possible oxygen sites being full, although other numbers may be used in certain embodiments.

Silicon and oxygen are currently widely used in conventional semiconductor processing, and, hence, manufacturers will be readily able to use these materials as described herein. Atomic or monolayer deposition is also now widely used. Accordingly, semiconductor devices incorporating the superlattice 25 in accordance with the invention may be readily adopted and implemented, as will be appreciated by those skilled in the art.

In one example implementation of the Si/O superlattice, for example, the number of silicon monolayers may be seven or less so that the energy band of the superlattice is common or relatively uniform throughout to achieve the desired advantages. However, in other embodiments a different spacing may be used, e.g., up to 5 nm or more. The 4/1 repeating structure shown in FIGS. 1 and 2, for Si/O has been modeled to indicate an enhanced mobility for electrons and holes in the X direction. For example, the calculated conductivity effective mass for electrons (isotropic for bulk silicon) is 0.26 and for the 4/1 SiO superlattice in the X direction it is 0.12 resulting in a ratio of 0.46. Similarly, the calculation for holes yields values of 0.36 for bulk silicon and 0.16 for the 4/1 Si/O superlattice resulting in a ratio of 0.44.

While such a directionally preferential feature may be desired in certain semiconductor devices, other devices may benefit from a more uniform increase in mobility in any direction parallel to the groups of layers. It may also be beneficial to have an increased mobility for both electrons and holes, or just one of these types of charge carriers as will be appreciated by those skilled in the art.

The lower conductivity effective mass for the 4/1 Si/O embodiment of the superlattice 25 may be less than two-thirds the conductivity effective mass than would otherwise occur, and this applies for both electrons and holes. Of course, the superlattice 25 may further comprise at least one type of conductivity dopant therein, as will also be appreciated by those skilled in the art.

Figure 3:
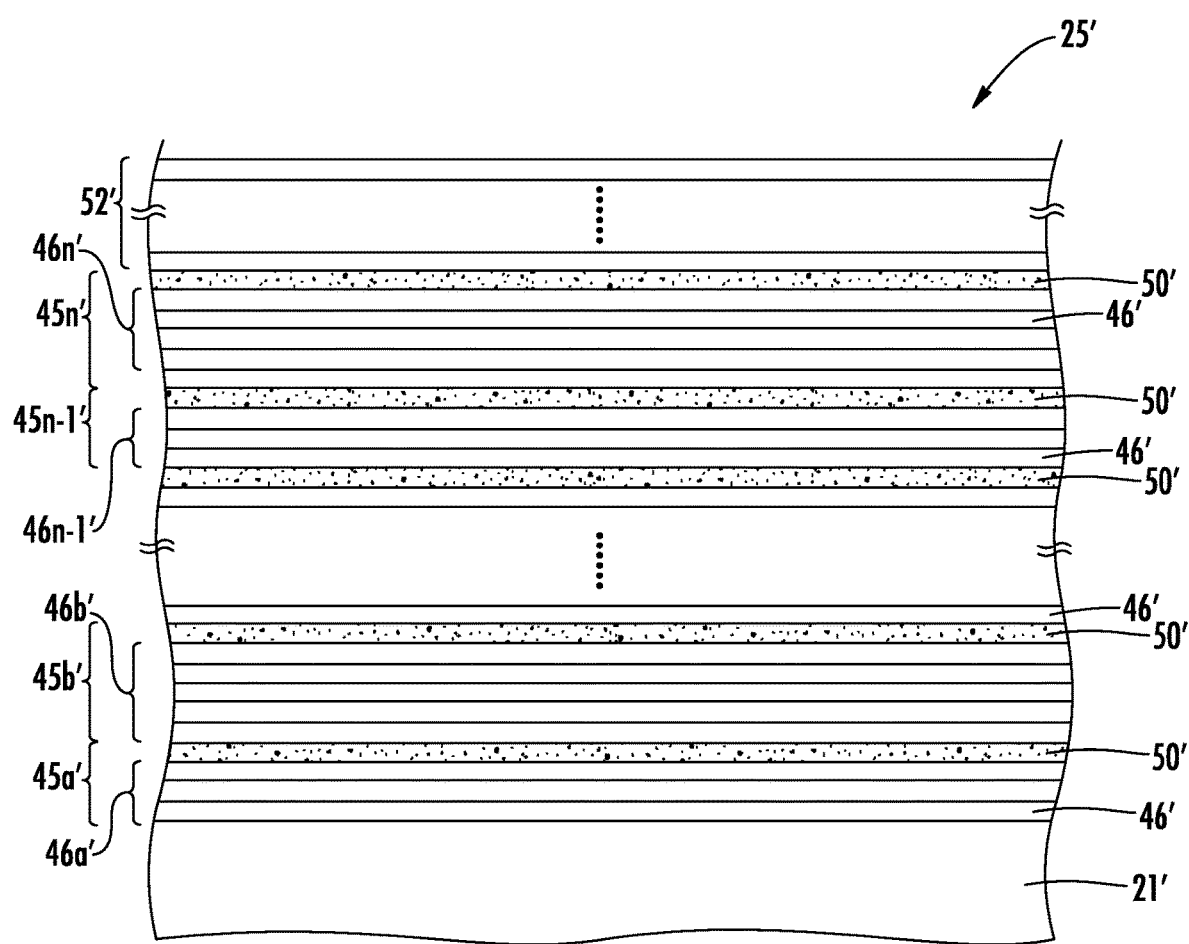
FIG. 3 is a greatly enlarged schematic cross-sectional view of another embodiment of a superlattice in accordance with an example embodiment.

Indeed, referring now additionally to FIG. 3, another embodiment of a superlattice 25' in accordance with the invention having different properties is now described. In this embodiment, a repeating pattern of 3/1/5/1 is illustrated. More particularly, the lowest base semiconductor portion 46a' has three monolayers, and the second lowest base semiconductor portion 46b' has five monolayers. This pattern repeats throughout the superlattice 25'. The energy band-modifying layers 50' may each include a single monolayer. For such a superlattice 25' including Si/O, the enhancement of charge carrier mobility is independent of orientation in the plane of the layers. Those other elements of FIG. 3 not specifically mentioned are similar to those discussed above with reference to FIG. 1 and need no further discussion herein.

In some device embodiments, all of the base semiconductor portions of a superlattice may be a same number of monolayers thick. In other embodiments, at least some of the base semiconductor portions may be a different number of monolayers thick. In still other embodiments, all of the base semiconductor portions may be a different number of monolayers thick.

Figure 4A:
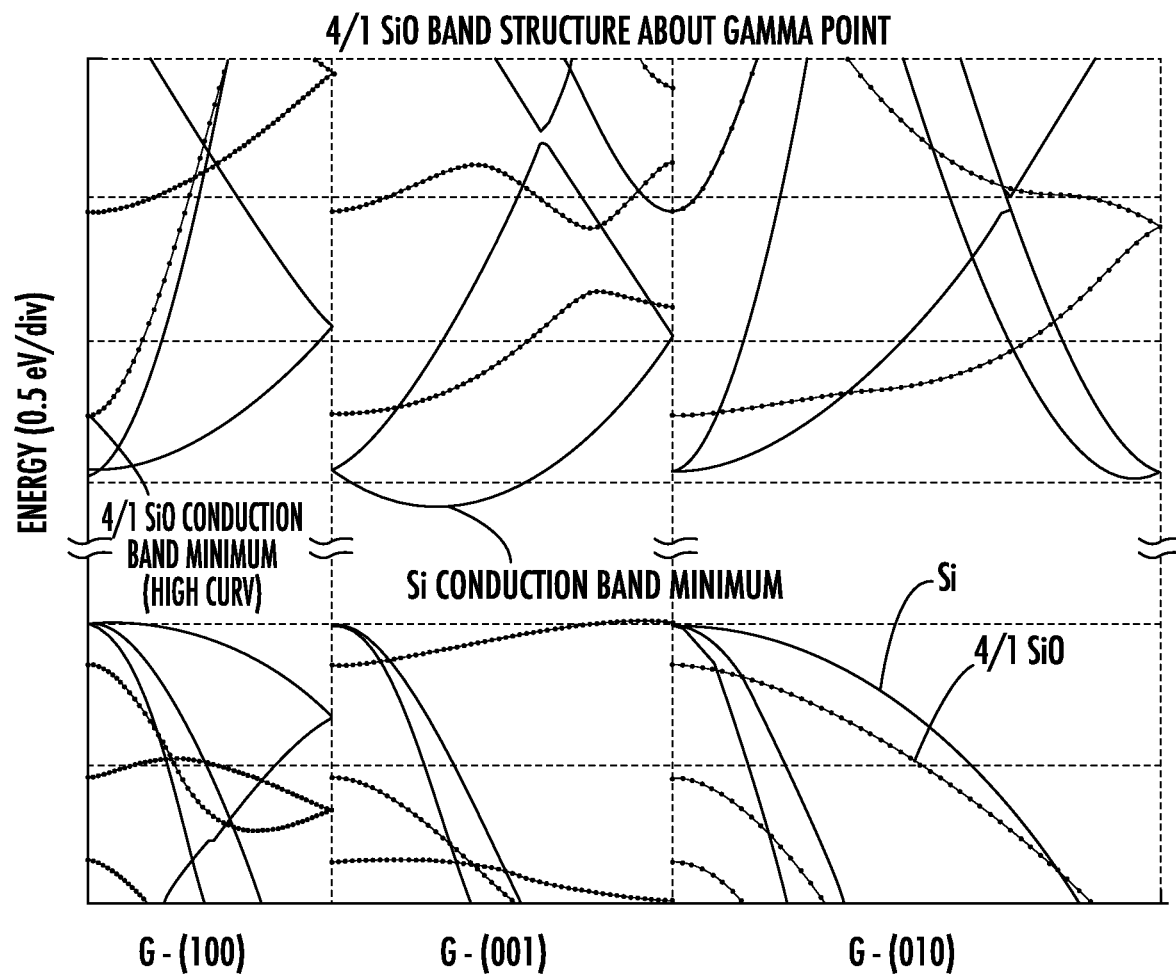
FIG. 4A is a graph of the calculated band structure from the gamma point (G) for both bulk silicon as in the prior art, and for the 4/1 Si/O superlattice as shown in FIGS. 1-2.
Figure 4B:
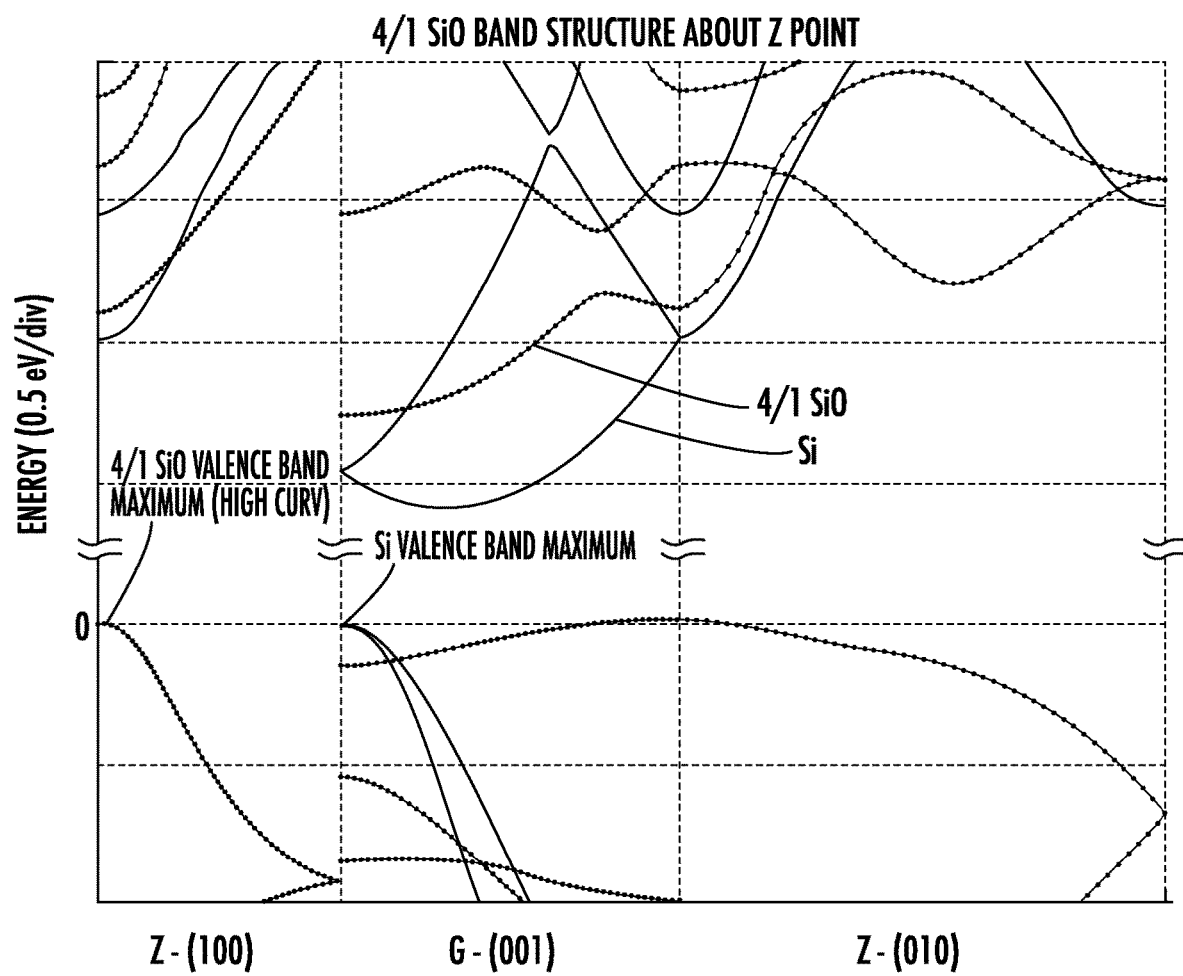
FIG. 4B is a graph of the calculated band structure from the Z point for both bulk silicon as in the prior art, and for the 4/1 Si/O superlattice as shown in FIGS. 1-2.
Figure 4C:
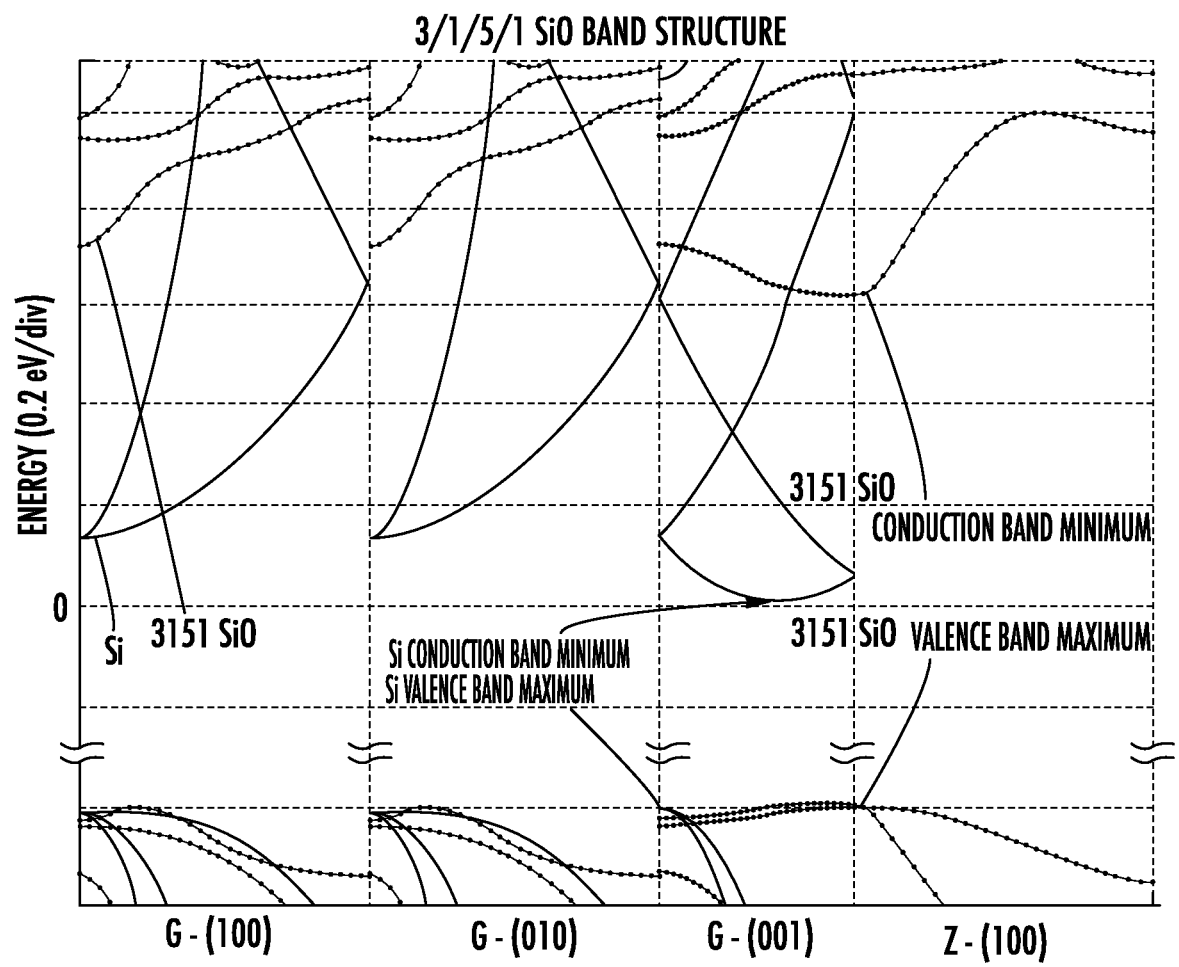
FIG. 4C is a graph of the calculated band structure from both the gamma and Z points for both bulk silicon as in the prior art, and for the 5/1/3/1 Si/O superlattice as shown in FIG. 3.

In FIGS. 4A-4C, band structures calculated using Density Functional Theory (DFT) are presented. It is well known in the art that DFT underestimates the absolute value of the bandgap. Hence all bands above the gap may be shifted by an appropriate "scissors correction." However the shape of the band is known to be much more reliable. The vertical energy axes should be interpreted in this light.

FIG. 4A shows the calculated band structure from the gamma point (G) for both bulk silicon (represented by continuous lines) and for the 4/1 Si/O superlattice 25 shown in FIG. 1 (represented by dotted lines). The directions refer to the unit cell of the 4/1 Si/O structure and not to the conventional unit cell of Si, although the (001) direction in the figure does correspond to the (001) direction of the conventional unit cell of Si, and, hence, shows the expected location of the Si conduction band minimum. The (100) and (010) directions in the figure correspond to the (110) and (−110) directions of the conventional Si unit cell. Those skilled in the art will appreciate that the bands of Si on the figure are folded to represent them on the appropriate reciprocal lattice directions for the 4/1 Si/O structure.

It can be seen that the conduction band minimum for the 4/1 Si/O structure is located at the gamma point in contrast to bulk silicon (Si), whereas the valence band minimum occurs at the edge of the Brillouin zone in the (001) direction which we refer to as the Z point. One may also note the greater curvature of the conduction band minimum for the 4/1 Si/O structure compared to the curvature of the conduction band minimum for Si owing to the band splitting due to the perturbation introduced by the additional oxygen layer.

FIG. 4B shows the calculated band structure from the Z point for both bulk silicon (continuous lines) and for the 4/1 Si/O superlattice 25 (dotted lines). This figure illustrates the enhanced curvature of the valence band in the (100) direction.

FIG. 4C shows the calculated band structure from both the gamma and Z point for both bulk silicon (continuous lines) and for the 5/1/3/1 Si/O structure of the superlattice 25' of FIG. 3 (dotted lines). Due to the symmetry of the 5/1/3/1 Si/O structure, the calculated band structures in the (100) and (010) directions are equivalent. Thus the conductivity effective mass and mobility are expected to be isotropic in the plane parallel to the layers, i.e. perpendicular to the (001) stacking direction. Note that in the 5/1/3/1 Si/O example the conduction band minimum and the valence band maximum are both at or close to the Z point.

Although increased curvature is an indication of reduced effective mass, the appropriate comparison and discrimination may be made via the conductivity reciprocal effective mass tensor calculation. This leads Applicant to further theorize that the 5/1/3/1 superlattice 25' should be substantially direct bandgap. As will be understood by those skilled in the art, the appropriate matrix element for optical transition is another indicator of the distinction between direct and indirect bandgap behavior.

Having described example MST film structures, an approach for depositing MST films 25 which provides for reduced defect densities is now described with reference to the flow diagram 100 of FIG. 5 and FIGS. 6-11. In particular, an approach is provided for making the above-described MST films 25 using a cyclic deposition and etch (CDE) process for growing the base semiconductor portions 46a-46n of the superlattice stack to advantageously reduce the amount of physical defects that are formed in the MST superlattice film. In an example implementation, the level of defects may be reduced by at least one to two orders of magnitude for a given amount of oxygen that is incorporated in the MST film stack. While the above-described approaches provide for MST films with relatively low defect levels plus significant mobility improvement and leakage reduction in semiconductor devices, the present approach advantageously provides for even further reduction in defect levels in MST film stacks for applications that may be particularly sensitive to such defects.

Generally speaking, the present approach uses a CDE process to form the base semiconductor portions 46a-46n, which are also referred to as "spacer layers" herein, using a single CDE cycle (meaning one cycle contains non-semiconductor (e.g., oxygen) dosing, spacer and etch back). The use of this etch back reduces the defects in the spacer layer by removing the initial start of the defects. The etching process more aggressively etches defective silicon faster than non-defective silicon. Etchant gas can only etch from the surface downward for non-defective regions of epitaxial growth, but the etch can attack in multiple directions where a defect is present.

Beginning at Block 101, the method illustratively includes a wafer or substrate 21 preparation step, which in this example is a load and bake (Block 102). Baking as an epitaxial growth surface pre-treatment is commonly used, although other approaches may be used to prepare the substrate 21 for epitaxial growth. More particularly, single crystal silicon surfaces typically require some type of surface preparation prior to epitaxial growth, such as a hydrogen bake. Another alternative would be a hydrofluoric acid (HF) wet clean with an $H_2O$ rinse, followed by a load and low temperature bake in a reduced pressure chemical vapor deposition reactor. Another approach may utilize a lower temperature chemical treatment similar to the AMAT Siconi or the ASM Previum processes, for example. One skilled in the art of epitaxial growth will understand that other suitable surface pre-treatment approaches may also be used, and the foregoing examples are not intended to be an exhaustive list of pre-treatment methods.

Figure 6:
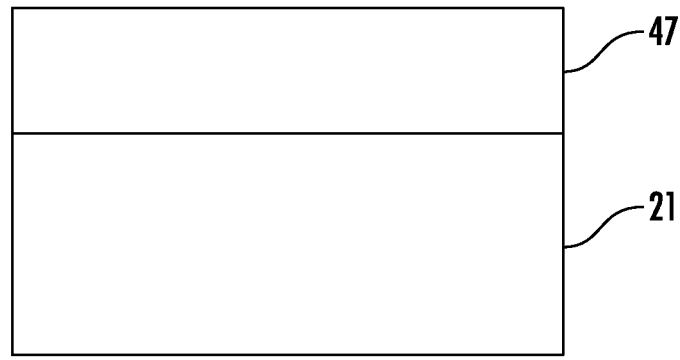
FIGS. 6-12 are a series of schematic cross-sectional diagrams illustrating corresponding steps to the method of FIG. 5.
Figure 7:
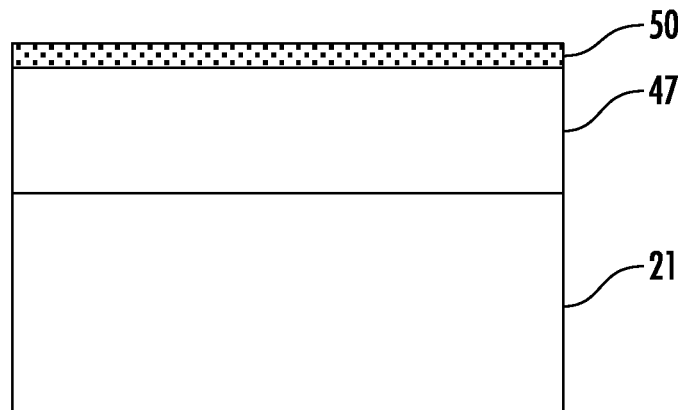

With the appropriate pre-treatment an in-situ semiconductor (e.g., epitaxial silicon) buffer layer 47 may then be formed on the substrate 21, at Block 103 (FIG. 6). An oxygen monolayer(s) 50 may then be formed on the buffer layer 47, at Block 104 (FIG. 7). One exemplary approach to forming non-semiconductor monolayers using $N_2O$ as an oxygen source is set forth in U.S. Pat. No. 9,558,939 to Stephenson et al., which is assigned to the present Applicant and hereby incorporated herein in its entirety by reference. However, it should be noted that other approaches and oxygen (or other non-semiconductor) delivery agents may also be used in different embodiments.

Figure 8:
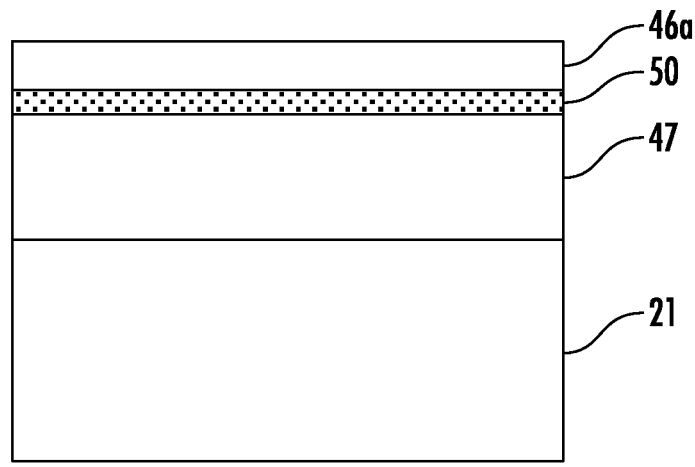
Figure 9:
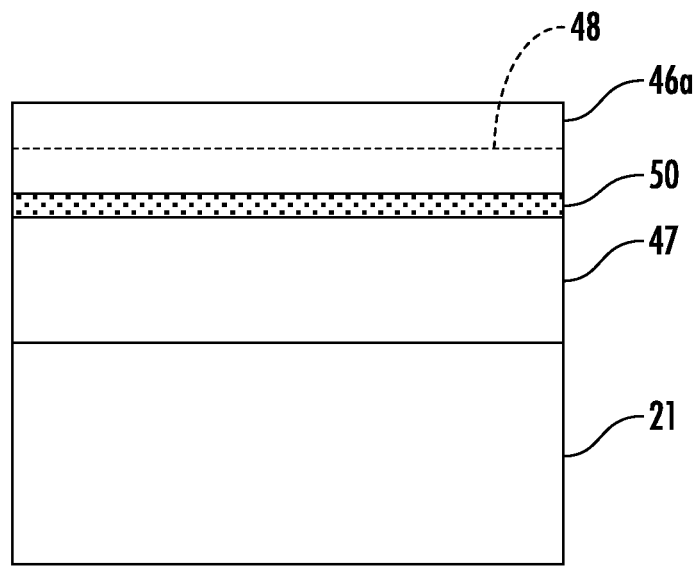
Figure 10:
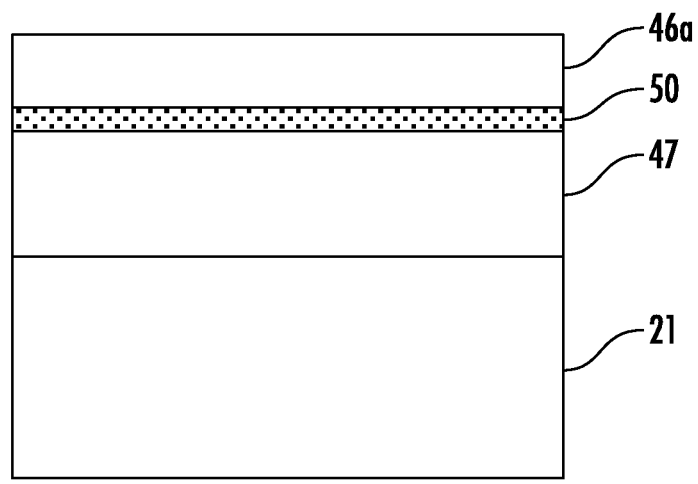
Figure 11:
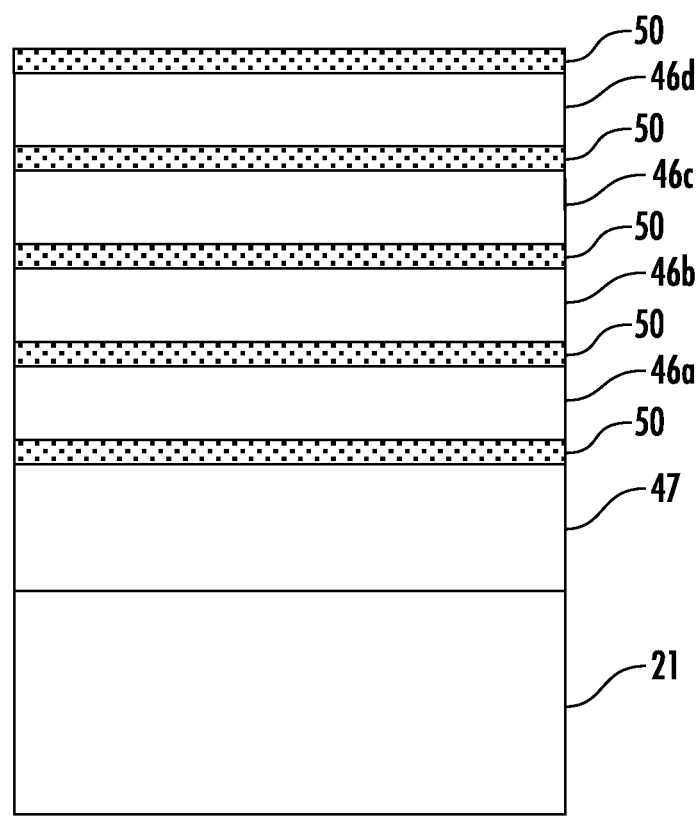

In the illustrated example, the first base silicon portion 46a is then formed by a blanket epitaxial silicon deposition of a first set of base silicon monolayers having a thickness in a range of 6-10 Å, and more particularly around 8 Å, at Block 105 (FIG. 8). Then, an intermediate anneal is performed (Block 106), followed by a blanket epitaxial growth of a second set of base silicon monolayers with a thickness in a range of 4-50 Å, at Block 107 (FIG. 9). The dashed line 48 in FIG. 9 shows the height of the first set of base silicon monolayers. More particularly, the second growth is an overgrowth that is thicker than the final desired thickness of the base silicon portion 46a. The overgrowth may then be etched back (Block 108, FIG. 10) to the final desired thickness of the base silicon portion 46a. By way of example, the amount of silicon that is etched back may be in a range of 2-50 Å in a typical implementation, for example.

The overgrowth and etch back operation may be implemented over a relatively wide range of temperatures and pressures. By way of example, the etch temperature range may be between 300° C. and 1200° C. More particularly, this temperature may be in a range between 400° C. and 800° C., and more specifically between 500° C. and 750° C. for typical implementations. An example pressure range may be between 1 Torr and 760 Torr for chemical vapor deposition processes, and more particularly between 10 Torr and 600 Torr. Generally speaking, lower pressure may be used in the low-pressure regime (P<1 Torr) and the Ultra High Vacuum regime (P<$10^{-7}$Torr). Etch back temperature and pressure may be isobaric and isothermal with the growth process, for example, to help provide higher process throughput.

While the CDE approach may be used over the entire pressure range noted above, high-pressure implementation in the reduced pressure process space may be desirable since at these pressures the adatom diffusion length is shorter than at LP and UHV. In the LP and UHV deposition, atoms are prone to diffusion toward step corners away from the deposition regions. As a result, reduced pressure deposited and etched superlattice deposition may have smoother surfaces than LP and UHV processed wafers, for example.

Example etchant gases may include $Cl_2$ and HCl. HCl and $Cl_2$ work well for superlattice structures deposited on patterned/structured wafers, as these etchants etch little or no oxides and/or nitrides of silicon in the temperature and pressure range used for atmospheric and reduced pressure chemical vapor deposition processes, for example. Other suitable etchants such as $NF_3$ may also be used, for example. A liquid etchant such as TMAH ($C_4H_{13}NO$) may be used to etch at room temperature by cyclically removing and reintroducing the wafers to the growth reactor.

The steps illustrated above with respect to Blocks 104-108 may then be repeated to create the desired number of groups of layers of the superlattice 25, at Block 109. In the example illustrated in FIG. 11, there are four groups of layers, but in other embodiments more or less groups may be used. Moreover, as noted above, each of the base silicon portions 46a-46d may have a same number of silicon monolayers, alternating numbers of silicon monolayers, or have different numbers of silicon monolayers in different embodiments.

Figure 5:
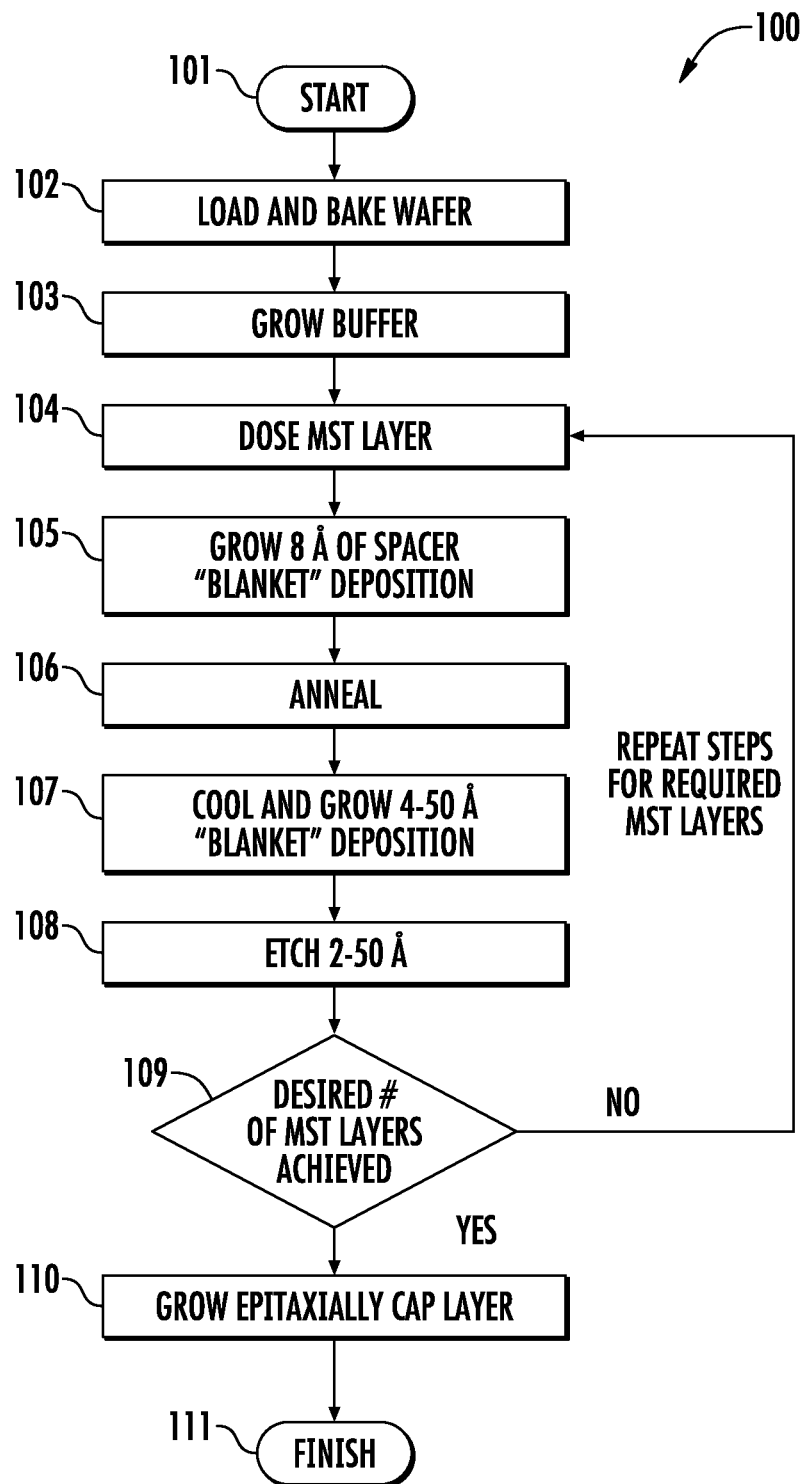
FIG. 5 is a flow diagram illustrating a process for making a superlattice in accordance with an example embodiment with reduced defect density.
Figure 12:
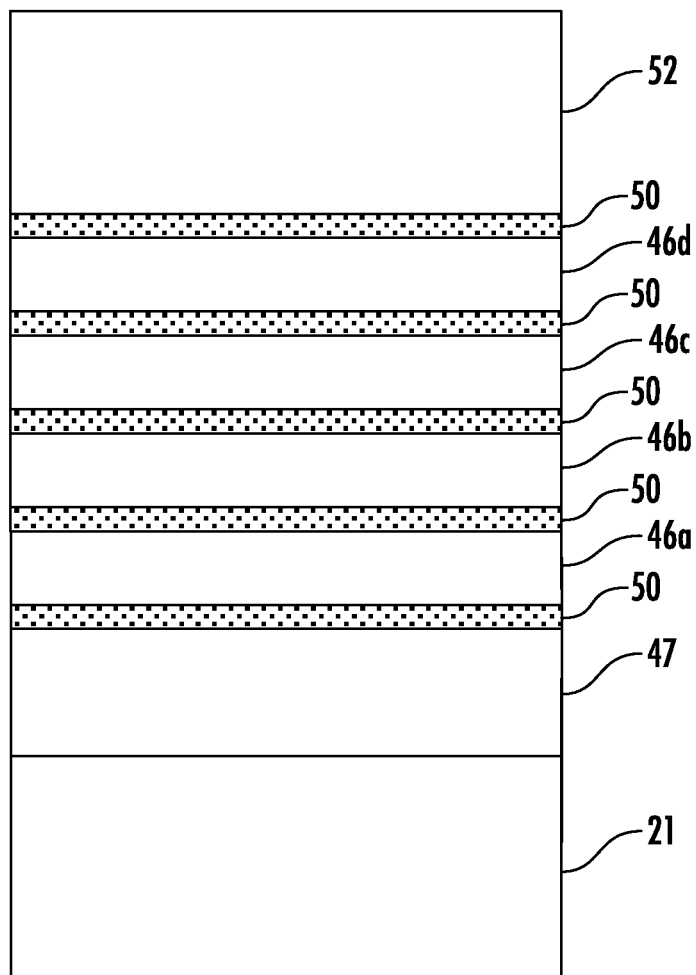

Once all of the base silicon portions 46a-46d and oxygen monolayers 50 are formed, another epitaxial silicon layer 52 may be grown (FIG. 12) to create the final cap layer for the superlattice 25 (Block 110). By way of example, selective epitaxial growth may be used for capping the MST film for typical applications, but in some instances non-selective, pseudo-selective, or any combination of the three growth methods may be used. Pseudo-selective growth involves a cyclic approach, i.e., one deposit and one etch. The method of FIG. 5 illustratively concludes at Block 111, although further processing steps may be performed to create different types of semiconductor devices incorporating the superlattice 25, as will be discussed further below.

The above-described process may be considered a pseudo-selective epitaxial growth, in which the amorphous and/or polysilicon etch rate is selected to be faster than the epitaxial etch rate. In other words, the poly and/or amorphous to epitaxial etch rate ratio is selected to be greater than one. If this were not the case, then the entire superlattice spacer would be lost during etching before the unwanted non-selective deposits were removed from the wafer non-single crystal structures. More particularly, the etch ratio may be adjusted based upon how aggressive of a defect reduction is desired in superlattices 25 for the given application. By way of example, the ratio of polysilicon and/or amorphous silicon to epitaxial etch selectivity may be greater than 1.5, and more particularly in a range of 1.5 to 10. However, higher selectivity ratios may also be used in some embodiments.

Figure 13:
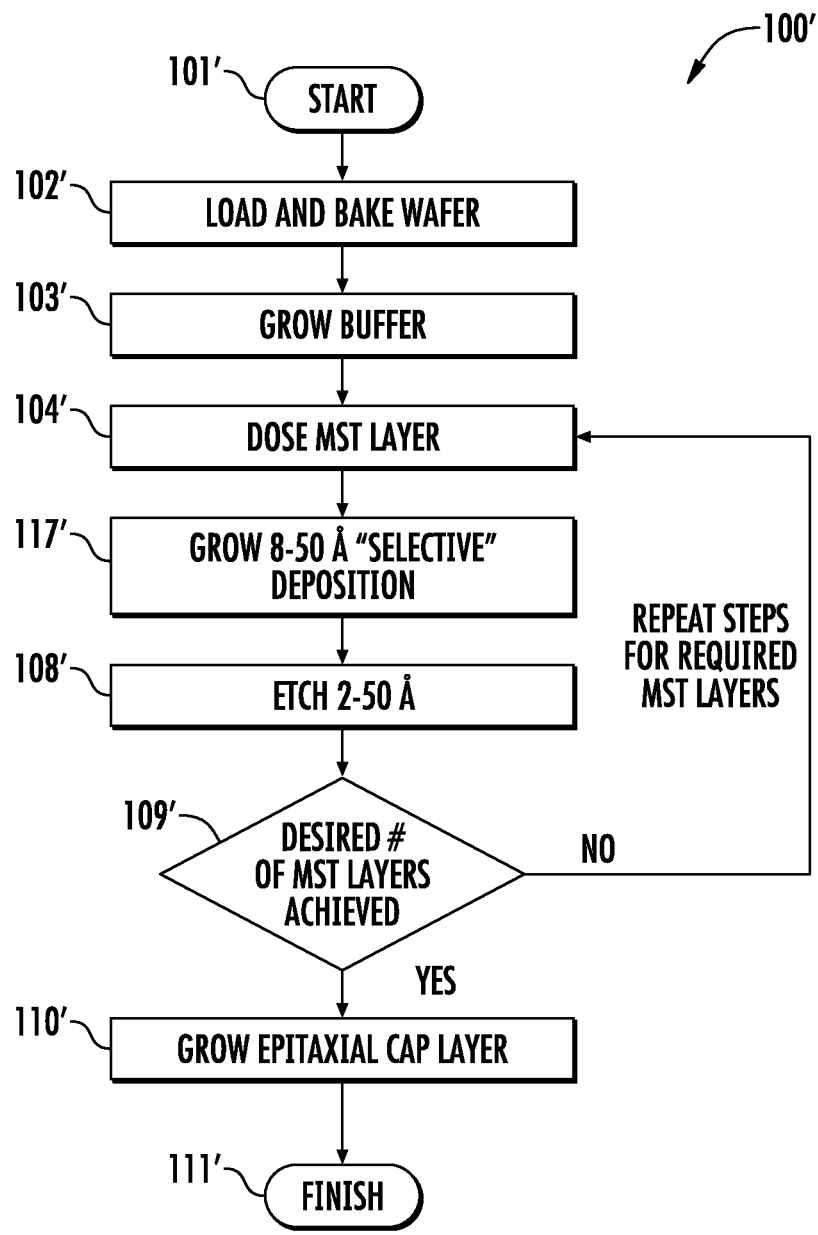
FIG. 13 is a flow diagram illustrating another process for making a superlattice in accordance with an example embodiment with reduced defect density.

Turning now to the flow diagram 100' of FIG. 13, another example approach is provided that is already selective without an etch back. Here, the initial blanket growth and anneal steps shown in FIG. 5 at Blocks 105-106 are omitted, and instead a cooling and selective epitaxial growth (e.g., 8 to 50 Å) is performed (Block 117') to define the base silicon portions 46a-46d of the superlattice 25. The subsequent etch back may be in a range of 2 to 50 Å, for example. In this case, one may choose an etch rate that is relatively high yet still controllable at the given pressure and temperature of the spacer growth such that defects are removed at the highest rate to minimize the impact to process throughput.

Both the pseudo selective process 100 and the selective process 100' have improved defectivity with the etch back. The amount of etch back may be tuned by increasing the amount of initial epitaxy grown, so there is a relatively wide window of possibilities for improved defectivity. The particular process values may be selected using the ranges provided above so that the amount of deposition and etch advantageously creates the desired spacer thickness and defect level for the final MST film 25. Here again, the number of groups of layers and thicknesses used for the spacers will vary based upon the desired application of the MST film 25, as will be appreciated by those skilled in the art.

Figure 14:
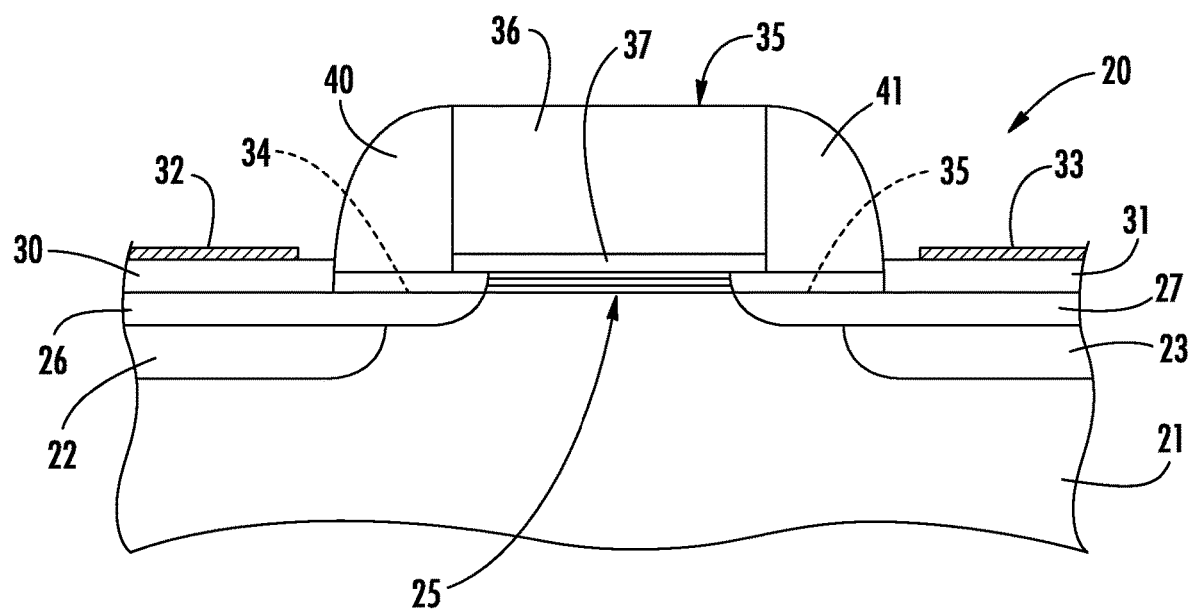
FIG. 14 is a schematic cross-sectional diagram of a semiconductor device incorporating a superlattice fabricated according to the method of FIG. 5 or FIG. 13.

As noted above, after the process steps shown in FIG. 5 or 13 are complete, additional processing steps may be performed to create various devices, such as a planar MOSFET 20 now described with reference to FIG. 14. One skilled in the art, however, will appreciate that the materials and techniques identified herein may be used in many different types of semiconductor devices, such as discrete devices and/or integrated circuits. The illustrated MOSFET 20 includes the substrate 21, source/drain regions 22, 23, source/drain extensions 26, 27, and a channel region therebetween provided by the superlattice 25. Source/drain silicide layers 30, 31 and source/drain contacts 32, 33 overlie the source/drain regions as will be appreciated by those skilled in the art. Regions indicated by dashed lines 34, 35 are optional vestigial portions formed originally with the superlattice 25, but thereafter heavily doped. In other embodiments, these vestigial superlattice regions 34, 35 may not be present as will also be appreciated by those skilled in the art. A gate 35 illustratively includes a gate insulating layer 37 adjacent the channel provided by the superlattice 25, and a gate electrode layer 36 on the gate insulating layer. Sidewall spacers 40, 41 are also provided in the illustrated MOSFET 20. Using the above-described fabrication techniques, defect densities of $\leq 1 \times 10^5/\text{cm}^2$ may be achieved in one or more of the base semiconductor portions 46a-46n of the superlattice 25 adjacent the non-semiconductor monolayer 50 interface.

It should also be noted that in some embodiments of the methods shown in FIGS. 5 and 13, additional epitaxial growth may optionally be performed after defect elimination (i.e., following the steps illustrated at Blocks 108, 108'). As noted above, the approaches discussed herein are advantageously used to help optimize the initial deposition to etch ratio to annihilate crystalline defects. Additional epitaxial growth may be desirable in some circumstances because for a given set of process conditions, the optimum final spacer thickness for device performance may be so thick that that it is beyond the optimal deposit to etch ratio. Thus, an additional amount of silicon spacer growth may be used, after defect elimination, to meet the device spacer thickness target. After the steps illustrated at Blocks 108, 108' are complete, the defects have already been removed and any additional epitaxial growth may be grown defect free, as will be appreciated by those skilled in the art.

By way of example, in an application with a desired 40 Å spacer between the inserted oxygen monolayers, epitaxially growing 60 Å and etching back 20 Å of the silicon may not be enough etch to get to the root of the defects, and for throughput considerations this may result in an undesirable amount of excess growth and etching. It may be more efficient to grow 16 Å total silicon and etch back 8 Å, leaving an 8 Å epitaxial spacer seed. Then, the remaining 32 Å may be grown in the present example.

Another potential advantage of this approach is film morphology. If a relatively thick spacer layer is grown and etched sufficiently to remove all defects in their entirety, this may lead to etch pits in the region where the defect once existed. The nature of the growth process is such that it along with surface migration will smooth these pits out if the indentations are shallow and small enough in diameter. There are some depths and diameters at which even enhanced growth kinetics and surface migration in and round the pit is not enough to allow for the pit to be leveled/smoothed/filled prior to finishing the superlattice growth.

Generally speaking, putting down oxygen at a higher rate will result in more defects, but also a higher oxidation throughput. One example of this would be oxidation at a higher than optimal dosing temperature, which may be near a higher silicon spacer growth temperature for throughput considerations. At a higher temperature some oxygen may bond with silicon in such a way that defects form in the silicon spacer deposit. However, the above-described approaches advantageously allow for some tradeoffs to be made in terms of process temperature, pressure, or carrier gas environment, which may not be optimal for oxidation, but still achieve a final low defect density epitaxial superlattice in addition to a high throughput process. The approach of targeting higher throughput may to the initial silicon layer being less than the device target spacer thickness. However, this may be acceptable because one may grow additional defect free silicon on top of the now defect free silicon spacer seed as described above to achieve the target spacer thickness.

Another example would be that defects are initiated as a result of the silicon growth process. Silicon grown at very low temperature (matching an improved oxidation temperature, for example) may have silicon adatoms that deposit and do not have time to move to proper lattice sites. This type of silicon growth situation may be generated by depositing the epitaxial layer in the 400 to 600° C. temperature range at high growth rates, for example. Silicon atoms that sit in interstitial sites can cause a dislocation to form and propagate throughout the subsequent epitaxial stack, for example. Again, the etch back will polish/remove the defects at an optimal deposition to etch ratio based on the process conditions chosen. Additional silicon may then be added after the etch to help insure that the final spacer thickness adheres to the desired device targets. The additional silicon may be grown in accordance with process conditions that result in defect free growth, as will be appreciated by those skilled in the art.

Many modifications and other embodiments will come to the mind of one skilled in the art having the benefit of the teachings presented herein. Therefore, it is understood that the disclosure is not to be limited to the specific exemplary embodiments disclosed herein.

That which is claimed is:

1. A method for making a semiconductor device comprising:
    forming a superlattice on a substrate comprising a plurality of stacked groups of layers, with each group of layers comprising a plurality of stacked base silicon monolayers defining a base silicon portion, and at least one oxygen monolayer constrained within a crystal lattice of adjacent base oxygen portions;
    wherein forming at least one of the base silicon portions comprises overgrowing the at least one base silicon portion and etching back the overgrown at least one base silicon portion.

2. The method of claim 1 wherein forming each base semiconductor portion further comprises:
    forming a first set of the base silicon monolayers;
    performing a thermal anneal; and
    forming a second set of the base silicon monolayers on the first set after the thermal anneal.

3. The method of claim 2 wherein the first set of the base silicon monolayers has a thickness in a range of 6-10 Å.

4. The method of claim 2 wherein the second set of the base silicon monolayers has a thickness in a range of 4-50 Å.

5. The method of claim 1 wherein etching back the overgrown at least one base silicon portion comprises etching between 2 and 50 Å of the at least one base silicon portion.

6. The method of claim 1 wherein etching back the overgrown at least one base silicon portion comprises etching the overgrown at least one base silicon portion at a temperature in a range of 500 to 750° C.

7. The method of claim 1 further comprising forming a semiconductor cap layer on the superlattice by forming a first semiconductor cap portion on the substrate at a first temperature, and forming a second semiconductor cap portion on the first semiconductor cap portion at a second temperature greater than or equal to the first temperature.

8. A method for making a semiconductor device comprising:
   forming a superlattice on a substrate comprising a plurality of stacked groups of layers, with each group of layers comprising a plurality of stacked base silicon monolayers defining a base silicon portion, and at least one oxygen monolayer constrained within a crystal lattice of adjacent base oxygen portions;
   forming a silicon cap layer on the superlattice;
   wherein forming at least one of the base silicon portions comprises overgrowing the at least one base silicon portion and etching back the overgrown at least one base silicon portion.

9. The method of claim 8 wherein forming each base semiconductor portion further comprises:
   forming a first set of the base silicon monolayers;
   performing a thermal anneal; and
   forming a second set of the base silicon monolayers on the first set after the thermal anneal.

10. The method of claim 9 wherein the first set of the base silicon monolayers has a thickness in a range of 6-10 Å.

11. The method of claim 9 wherein the second set of the base silicon monolayers has a thickness in a range of 4-50 Å.

12. The method of claim 8 wherein etching back the overgrown at least one base silicon portion comprises etching between 2 and 50 Å of the at least one base silicon portion.

13. The method of claim 8 wherein etching back the overgrown at least one base silicon portion comprises etching the overgrown at least one base silicon portion at a temperature in a range of 500 to 750° C.

* * * * *